United States Patent [19]
Silvia

[11] 3,947,695
[45] Mar. 30, 1976

[54] SIGNAL CONDITIONER FRONT-END

[75] Inventor: Philip J. Silvia, Newton, Mass.

[73] Assignee: The United States of America as represented by the Secretary of the Department of Transportation, Washington, D.C.

[22] Filed: Oct. 21, 1974

[21] Appl. No.: 516,448

[52] U.S. Cl. ............................ 307/85; 330/30 D
[51] Int. Cl.² ........................................ H02J 1/00
[58] Field of Search ........ 307/85, 51, 57; 330/30 R, 330/30 D; 323/16

[56] References Cited
UNITED STATES PATENTS

| | | | |
|---|---|---|---|
| 3,453,554 | 7/1969 | Shoemaker | 330/30 R |
| R27,351 | 5/1972 | McGraw et al. | 330/30 R |

Primary Examiner—Robert K. Schaefer
Assistant Examiner—M. Ginsburg
Attorney, Agent, or Firm—Herbert E. Farmer; Harold P. Deeley, Jr.

[57] ABSTRACT

A means of providing signal conditioning, without degradation, for transducers having various excitation voltages prior to application to systems apparatus for further processing.

1 Claim, 1 Drawing Figure

SIGNAL CONDITIONER FRONT-END

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

Electronic systems fabricated from components which include commercially available transducer and processing units from differing sources quite often are incompatible.

TRansducers all too often have differing excitation voltages (or even none at all) and cannot be coupled directly to available processing units. Redesign of the front end of the processing unit is necessary. The power supplies most often encountered are ± 15 volts or + 28 ± 4 volts. It is obvious then that the excitation of the processing unit and the transducer may easily differ. In coupling the units together in a system, signal quality may be sacrificed.

Even when the transducer and processing unit have compatible excitation voltages, quite often the output from the transducer could be single ended or differential which creates further problems for the designer. Disclosed herein is a front end device which provides compatible coupling for the differing excitation voltages for both the transducer and the processing unit and thereby enables a designer to radically extend his selection of transducers and processing units.

SUMMARY OF THE INVENTION

This invention is characterized by circuitry capable of coupling transducers and signal processing devices with differing excitation voltages including plus (+) and or minus (−) 15 volts, 28 ± 4 volts, or no transducer excitation voltage, and transducers having single ended or differential output, without degradation of signal quality. The circuitry constitutes the front end of signal processing units intended to receive transducer signals for processing in selected systems. Therefore, an object of the present invention is to provide a front end device having circuitry capable of coupling transducers and processing units with differing excitation voltage.

Another object of the present invention is to provide a front end device capable of joining transducers with different modes of coupling including single ended and differential output to various processing units.

Still another object of the present invention is to provide a front end device for signal processing which extends the range in selection of transducers commercially available.

And still another object of the present invention is to provide a front end device which reduces the burden on a systems designer with reference to signal constraints when coupling transducers to processing units.

DESCRIPTION OF THE DRAWING

The foregoing objects and many of the attendant advantages of this invention will become more readily appreciated as the same becomes better understood by reference to the following detailed description when taken in conjunction with the accompanying drawing wherein.

DESCRIPTION OF THE PREFERRED EMBODIMENT

Figure 1:
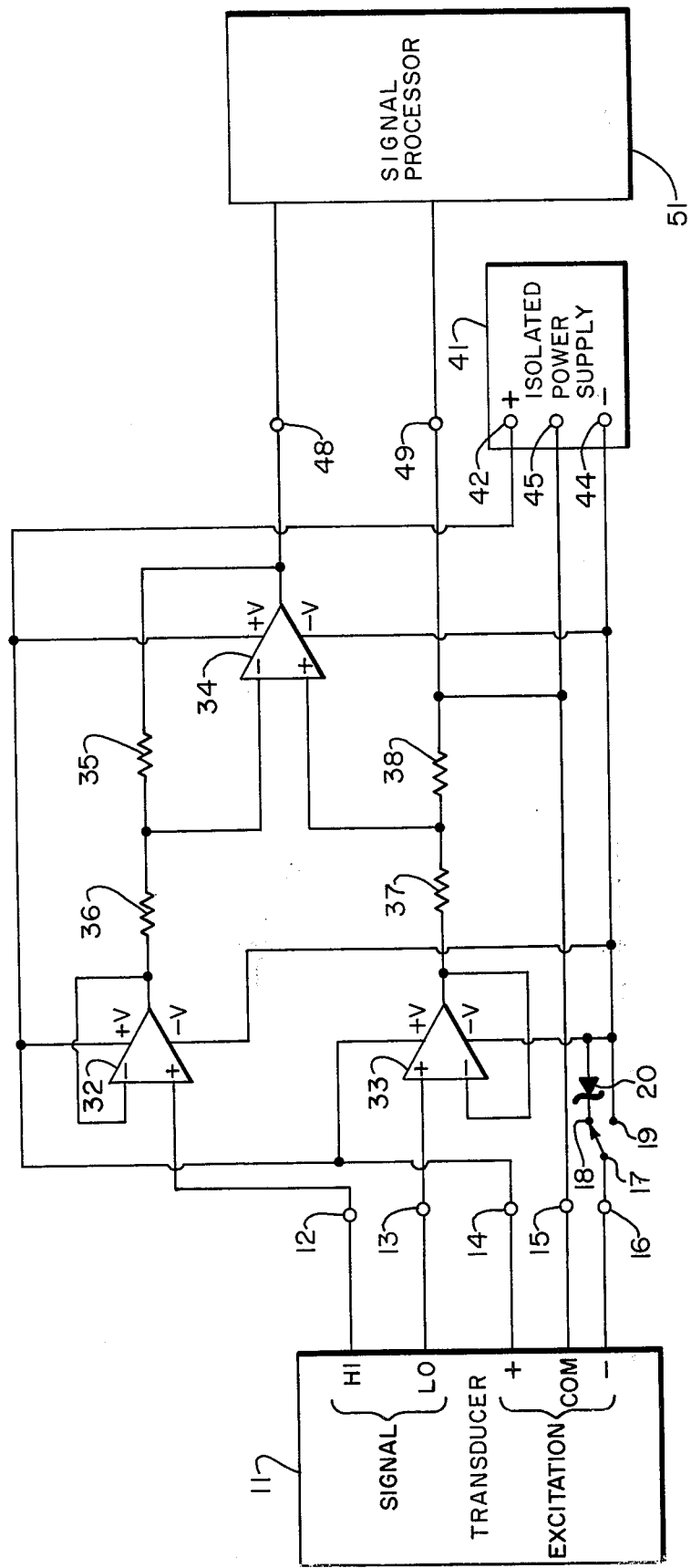
FIG. 1 is a block and circuit diagram of the preferred embodiment of the invention.

A major portion of the commercially available transducers have the following excitation requirements:
1. Transducers requiring plus (+) and minus (−) 15 volts DC (such as the Endevco Q-flex series of servo accelerometers).
2. Transducers requiring 28 ± 4 volts DC (such as the American Aerospace Industries current sensors).
3. Transducers that do not require any excitation voltage (such as the Dale voltage dividers).

Each of the above three groups of commercially available transducers can be further subdivided as:
 a. Single ended outputs; that is, transducers whose signal return path coincides with the excitation source return path, or
 b. Differential outputs; that is, transducers having a signal output and signal return which are isolated from the excitation source return path.

Transducer and signal processing units having differing excitation voltages or mode of coupling creates problems for the designer. The options available to him are:
1. Build or procure a signal conditioner which is compatible with the transducer being used, or
2. Procure another transducer which will provide the same function and be compatible with the signal processing unit, or
3. Use independent excitation voltage sources for the transducer and the signal processing unit. However, it must be noted that one of the excitation voltage sources must have a floating output (the transducer, or the signal processing unit) otherwise low-frequency signals will be sacrificed in order to eliminate DC bias by means of capacitive coupling.

Referring to FIG. 1, with the present invention, none of the above unwanted alternatives are required. SIGNAL HI is applied to terminal 12. SIGNAL LO is applied to terminal 13. The + EXCITATION is applied to terminal 14, plus and minus 15 volt COMMON excitation is applied to terminal 15, and −EXCITATION is applied to terminal 16. Amplifiers 32, 33 and 34 are standard, commercially-available operational amplifiers (such as the Fairchild $\mu$A 741). Amplifiers 32 and 33 are wired to operate as unity gain voltage followers and provide approximately 400 megohms input impedance for the SIGNAL HI and SIGNAL LO, respectively. Amplifiers 32 and 33 in conjunction with amplifier 34 form a differential input, unity gain, inverting amplifier. Gain accuracy is achieved by carefully matching the values of the resistors 36, 37, 35 and 38.

Power supply 41 is any well-regulated, isolated supply capable of providing ± 15 volts at terminal 42 and −15 volts at terminal 44 with a common at terminal 45. (If only a 30 VDC supply is available, then a post-regulator must be added to establish the excitation midpoint COMMON 45.) With power supply 41, the differential amplifier can handle all signals that range between ± 13.3 volts, referred to common 45.

Switch 17 selects the excitation voltages to be used by the transducer input device. When switch 17 is in position 19, the input device receives ± 15 volts excitation. When switch 17 is in position 18, a Zener diode 20 is placed in series with the input device and power supply. The Zener diode can be any Zener diode that has a Zener voltage between 2 and 6 volts.

The purpose of zener diode 20 is to float the power return (−EXCITATION) and SIGNAL LO into the operating range of the differential amplifier. The amplifier can then reject the common mode offset voltage and shift the level of the signal reference point to the amplifier COMMON.

The use of the Zener diode in conjunction with the differential input amplifier makes the circuit compatible with all three categories of transducers.

In operation the circuit is interconnected to the transducer as follows with the specified excitation voltage.

1. ± 15 VDC excitation. Switch 17 is placed in position 19. Connections are provided for + EXCITATION (+15 volts) 14, −EXCITATION (−15 volts) 16, ± volts COMMON 15, SIGNAL HI 12, and SIGNAL LO 13. (For these devices which do not have an isolated output, the SIGNAL LO is jumpered to the ± volts COMMON 15.)

2. 28 ± 4 VDC excitation. Switch 17 is placed in position 18. Connections are provided for + EXCITATION 14 (+30−$V_2$ volts), −EXCITATION 16 (power return), SIGNAL HI 12 and SIGNAL LO 13 (± 15 COMMON is not used). (For those devices which do not have an isolated output, the SIGNAL LO is jumpered to the − EXCITATION 16).

3. No excitation source. Since these input devices do not require an excitation source, connections need only be provided for the SIGNAL HI 12 and SIGNAL LO 13. However, SIGNAL LO 13 is normally jumpered to the ± 15 COMMON 15 to prevent the signal from drifting out of the common mode range of the amplifier. Switch 17 has no effect on these devices.

Present state of the art conditioners or signal processers that are available have very limited application due to the incompatibility with the transducers alluded to above. With the present invention, the range of application have included the three most commonly encountered categories of transducers commercially available.

It is contemplated that the circuit shown in this invention will be made part of a further processing or signal conditioning unit 51. The reason for this is that the circuit as shown only provides signal buffering, excitation voltage, and signal level shifting. It is contemplated that additional processing of a given device would include signal gain, bandpass filtering, system calibration, and finally offset adjustment. The present invention, therefore, properly provides an interface between commercially available transducers and commercially available processig units having the functions enumerated above.

The aerospace industry has numerous transducers requiring voltages of 28 ± 4 volts on the one hand while devices requiring integrated circuits increasingly have settled upon ± 15 volts. For example, a sensor may require excitation of ± 15 volts and, have a single ended output. A second sensor may require 28 volts. A curent shunt may require a high-voltage isolation amplifier and only + 15 volts excitation. And a passive voltage divider may have a differential output and require no voltage excitation. Therefore, the present invention has numerous applications in both the aerospace industry and electronics area in which integrated circuits are used.

While the invention has been described with reference to specific apparatus, it is not intended to be limited thereby, for those skilled in the art may make many substitutions and variations without departing from the invention's true, scope and spirit, as defined in the appended claims.

What is claimed is:

1. A signal conditioner front-end comprising:
   a differential input inverting amplifier having input terminals for transducer SIGNAL HI and SIGNAL LO, ±15 VDC, −15 VDC, and COMMON; and output terminals for SIGNAL OUTPUT and COMMON:
   first, second, and third operational amplifiers each having terminals for inverting and noninverting inputs, +15 VDC, −15 VDC and output;
   the ±15 VDC terminal of each of said operational amplifiers connected to the +15 VDC input terminals of said differential amplifier,
   the −15 VDC terminal of each of said operational amplifiers connected to the −15 VDC input terminal of said differential amplifier,
   the output terminal is connected to the inverting input terminal of each of said first and second operational amplifiers; and
   the SIGNAL HI input terminal of said differential amplifier is connected to the noninverting input terminal of said first operational amplifier,
   the output terminal of said third operational amplifier is connected to the SIGNAL OUTPUT terminal of said differential amplifier,
   a first resistive divider comprising first and second series connected matched resistors connected between the output terminals of said first and third operational amplifiers with the junction of said first and second resistors connected to the inverting input terminal of said third operational amplifier;
   a second resistive divider comprising third and fourth series connected matched resistors connected between the output terminal of said second operational amplifier and the COMMON input terminal of said differential amplifier with the junction of said third and fourth resistors connected to the noninverting input terminal of said third operational amplifier;
   an excitation voltage selector circuit comprising output terminals for + EXCITATION, − EXCITATION, and COMMON;
   the +15 VDC input terminal of said differential amplifier is connected to the + EXCITATION output terminal of said selector circuit,
   the COMMON input terminal of said differential amplifier is connected to the COMMON output terminal of said selector circuit,
   said excitation voltage selector circuit further including switching means having a normally open contact terminal, a normally closed contact terminal and a wiper terminal,
   the wiper terminal of said switching means is connected to the −EXCITATION output terminal of said selector circuit,
   the normally closed contact terminal of said switching means is connected to the −15 VDC input terminal of said differential amplifier; and
   a Zener diode connected between the normally closed and normally open contact terminals of said switching means.

* * * * *

UNITED STATES PATENT OFFICE
CERTIFICATE OF CORRECTION

Patent No. 3,947,695      Dated  March 30, 1976

Inventor(s)  Phillip J. Silvia

It is certified that error appears in the above-identified patent and that said Letters Patent are hereby corrected as shown below:

Under "Inventor," data element [75] on the front page, the inventor's name appears as "Philip J. Silvia" and should be corrected to "Phillip J. Silvia."

*Signed and Sealed this*

*twenty-second* Day of *June 1976*

[SEAL]

Attest:

RUTH C. MASON
*Attesting Officer*

C. MARSHALL DANN
*Commissioner of Patents and Trademarks*